US009473198B1

(12) United States Patent
Martin

(10) Patent No.: US 9,473,198 B1
(45) Date of Patent: *Oct. 18, 2016

(54) APPARATUS AND METHOD FOR BYPASSING AMPLIFIERS USED TO AMPLIFY SIGNALS RECEIVED BY WIRELESS COMMUNICATION SYSTEMS

(71) Applicant: Juniper Networks, Inc., Sunnyvale, CA (US)

(72) Inventor: John R. Martin, Danville, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/981,527

(22) Filed: Dec. 28, 2015

Related U.S. Application Data

(63) Continuation of application No. 13/894,777, filed on May 15, 2013, now Pat. No. 9,264,093.

(51) Int. Cl.
*H04B 1/48* (2006.01)
*H03F 3/19* (2006.01)
*H03F 1/26* (2006.01)

(52) U.S. Cl.
CPC ............. *H04B 1/48* (2013.01); *H03F 1/26* (2013.01); *H03F 3/19* (2013.01); *H03F 2200/231* (2013.01); *H03F 2200/294* (2013.01); *H03F 2200/451* (2013.01)

(58) Field of Classification Search
CPC .............. H03F 2203/7236; H03F 2203/7233; H03G 2201/506; H03G 3/3026; H03G 1/0088
See application file for complete search history.

(56) References Cited

U.S. PATENT DOCUMENTS

| 5,722,063 | A | * | 2/1998 | Peterzell | H03F 3/72 455/13.4 |
| 5,867,777 | A | * | 2/1999 | Yamaji | H03F 1/0277 330/9 |
| 5,909,643 | A | * | 6/1999 | Aihara | H03G 1/0088 330/51 |
| 5,978,665 | A | * | 11/1999 | Kim | H04B 17/318 455/249.1 |
| 6,591,086 | B1 | | 7/2003 | Pleasant | |
| 6,838,933 | B2 | | 1/2005 | Goyette et al. | |
| 7,373,115 | B2 | | 5/2008 | Monroe | |
| 2002/0047811 | A1 | * | 4/2002 | Okanobu | H03G 1/0088 343/876 |
| 2003/0073423 | A1 | * | 4/2003 | Cho | H04B 1/109 455/324 |
| 2005/0104655 | A1 | * | 5/2005 | Huber | H03F 3/72 330/51 |
| 2006/0164163 | A1 | * | 7/2006 | Apel | H03F 1/0277 330/151 |
| 2007/0257999 | A1 | * | 11/2007 | Chou | H03F 1/0277 348/300 |
| 2008/0102763 | A1 | | 5/2008 | Yoon | |
| 2009/0017772 | A1 | * | 1/2009 | Kemmochi | H04B 1/006 455/73 |
| 2009/0153245 | A1 | * | 6/2009 | Lee | H03F 1/3211 330/254 |
| 2010/0022211 | A1 | * | 1/2010 | Huang | H04W 52/52 455/232.1 |
| 2010/0301942 | A1 | * | 12/2010 | Hasan Abrar | H03F 1/0277 330/277 |

(Continued)

*Primary Examiner* — Bobbak Safaipour
*Assistant Examiner* — Devan Sandiford
(74) *Attorney, Agent, or Firm* — ALG Intellectual Property, LLC

(57) ABSTRACT

An apparatus may include a multi-throw switch having a common terminal connected to an antenna of a wireless communication system. The multi-throw switch may be configured to direct signals received from the antenna between (1) an amplification path that connects a receive terminal of the multi-throw switch to a receiver of the wireless communication system and (2) at least one bypass path that connects an additional receive terminal of the multi-throw switch to the receiver. The amplification path may include at least one amplifier that amplifies signals received from the antenna, and the bypass path may have a gain that is less than a gain of the amplification path. Various other systems and methods are also disclosed.

20 Claims, 7 Drawing Sheets

(56) References Cited

U.S. PATENT DOCUMENTS

| | | | |
|---|---|---|---|
| 2014/0084997 A1* | 3/2014 | Simmonds | H01L 25/00 327/564 |
| 2014/0256271 A1* | 9/2014 | Kok | H04B 1/44 455/78 |
| 2015/0055733 A1* | 2/2015 | Asano | H04B 1/525 375/297 |

* cited by examiner

APPARATUS AND METHOD FOR BYPASSING AMPLIFIERS USED TO AMPLIFY SIGNALS RECEIVED BY WIRELESS COMMUNICATION SYSTEMS

CROSS REFERENCE TO RELATED APPLICATION

This application is a continuation of U.S. application Ser. No. 13/894,777 filed 15 May 2013, the disclosure of which is incorporated, in its entirety, by this reference.

BACKGROUND

Modern wireless communication systems are typically designed to detect and successfully receive data from both near and distant clients. Because the signals received from distant clients are often weak, these systems may include an amplifier (such as a low-noise amplifier) designed to boost weak signals to a desirable level for processing by a receiver. In addition, because a low-noise amplifier may boost strong signals received from nearby clients to an unacceptably high level, these systems may also attempt to bypass or turn off this low-noise amplifier when strong signals from nearby clients are received in order to avoid saturating the receiver.

Unfortunately, traditional approaches to bypassing or turning off low-noise amplifiers often suffer from a variety of drawbacks and deficiencies. For example, the switching components required to bypass a low-noise amplifier (whether external to or integrated within the low-noise amplifier) may, especially when combined with a transmit-receive switch (such as those used in a time-division duplexing (TDD) system), significantly increase the noise figure of the low-noise amplifier and/or contribute to the overall noise figure of the system. The amount of attenuation provided by these switching components (relative to the gain of the low-noise amplifier) is also typically fixed and not customizable. In addition, because the amount of attenuation provided by a low-noise amplifier in its off-state is typically determined by its inherent off-state parasitics, the amount of attenuation achieved (relative to the gain of the low-noise amplifier) by placing the low-noise amplifier in its off-state is also typically fixed and not customizable.

Because the traditional approaches outlined above may compromise the overall noise figure of the system and/or only offer fixed attenuation, these approaches may prevent wireless communications systems from achieving desired communication-link margins and/or quality. The instant disclosure, therefore, identifies a need for an improved apparatus, system, and method for bypassing amplifiers (such as low-noise amplifiers) that amplify signals received by wireless communication systems.

SUMMARY OF THE INVENTION

As will be described in greater detail below, the instant disclosure generally describes improved apparatuses and methods for bypassing amplifiers that amplify signals received by wireless communication systems. In one example, an apparatus for performing such a task may include a multi-throw switch having a common terminal connected to an antenna of a wireless communication system. The multi-throw switch may be configured to direct signals received from the antenna between (1) an amplification path that connects a receive terminal of the multi-throw switch to a receiver of the wireless communication system and (2) at least one bypass path that connects an additional receive terminal of the multi-throw switch to the receiver. The amplification path may include at least one amplifier that amplifies signals received from the antenna, and the bypass path may have a gain that is less than a gain of the amplification path.

Similarly, a wireless communication system may include an antenna, a receiver, and a multi-throw switch having a common terminal connected to the antenna. The multi-throw switch may be configured to direct signals received from the antenna between (1) an amplification path that connects a receive terminal of the multi-throw switch to the receiver and (2) at least one bypass path that connects an additional receive terminal of the multi-throw switch to the receiver. The amplification path may include at least one amplifier that amplifies signals received from the antenna, and the bypass path may have a gain that is less than a gain of the amplification path.

A corresponding method may include (1) identifying at least one characteristic indicative of received signal strength at an antenna of a wireless communication system and then (2) directing, based at least in part on the identified characteristic, signals received from the antenna between an amplification path and at least one bypass path. The amplification path may connect the antenna to a receiver of the wireless communication system and may include at least one amplifier that amplifies signals received from the antenna. The bypass path may connect the antenna to the receiver and have a gain that is less than a gain of the amplification path.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
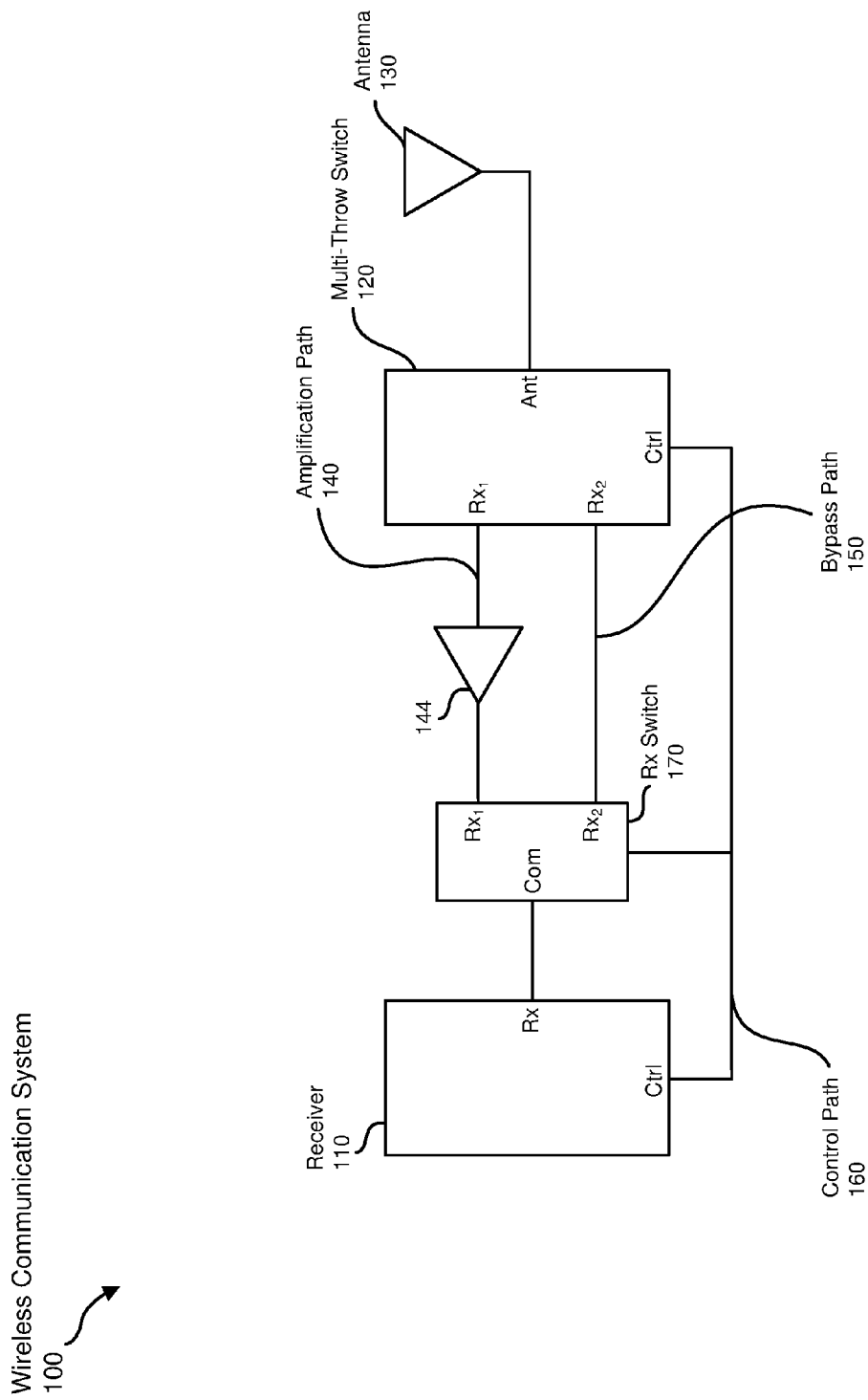
FIG. 1 is a block diagram of an exemplary wireless communication system capable of bypassing received-signal amplifiers.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to improved apparatuses and methods for bypassing amplifiers used to amplify signals received by wireless communication systems. As will be explained in greater detail below, by replacing the traditional cascade of transmit/receive and bypass switches positioned between an antenna and an amplifier used to amplify signals received from the antenna with a single multi-throw switch, the embodiments described herein may optimize the overall noise figure of a wireless communication system. In addition, by providing at least one amplifier bypass path from this multi-throw switch, the embodiments disclosed herein may allow for the gain/attenuation of this bypass path to be customized without having to modify the amplifier itself. Moreover, by using a variable-gain amplifier and/or variable attenuator in this bypass path and/or by providing a plurality of bypass paths having differing gains, the embodiments disclosed herein may enable the wireless communication system to granularly select appropriate gain/attenuation levels for received signals based on their signal strength, potentially resulting in improved communication-link margins and quality.

The following will provide, with reference to FIGS. 1-5, examples of wireless communication systems capable of bypassing received-signal amplifiers. A detailed description of an exemplary method for bypassing received-signal amplifiers will then be provided in connection with FIG. 6. Finally, the discussion corresponding to FIG. 7 will provide examples of systems that may include the components shown in FIGS. 1-5.

FIG. 1 is a block diagram of an exemplary wireless communication system 100 capable of bypassing received-signal amplifiers. The term "wireless communication system," as used herein, generally refers to any type or form of device capable of receiving, transmitting, and/or processing modulated signals, such as radio waves. Examples of such wireless communication systems include, without limitation, wireless access points (including, e.g., TDD and frequency-division duplexing (FDD) systems), wireless routers, and/or devices and systems capable of managing such wireless access points and routers.

As illustrated in FIG. 1, wireless communication system 100 may include a multi-throw switch 120 connected to an antenna 130. The term "multi-throw switch," as used herein, generally refers to any type or form of mechanical, electrical, or electronic device or component (or group of devices or components, active or passive) capable of diverting electric current from one electrical path to one or more alternative electrical paths. In one example, the term "multi-throw switch" may also refer to a switch capable of connecting (using passive and/or active components) a common terminal to one of a plurality of other terminals. An example of a multi-throw switch, includes, without limitation, a single pole, N-throw switch, such as a single pole, double throw (SP2T) switch or a single pole, triple throw (SP3T) switch.

In the example illustrated in FIG. 1, multi-throw switch 120 may be capable of connecting a common terminal (Ant) to one of a plurality of receive terminals ($Rx_1$ or $Rx_2$). In this example, the Ant terminal of multi-throw switch 120 may be connected (either directly or indirectly) to antenna 130. The term "antenna," as used herein, generally refers to any type or form of device capable of converting electrical power into radio waves, and vice versa. An antenna (such as antenna 130) may possess any of a variety of desired parameters, such as a desired radiation pattern, effective area, efficiency, bandwidth, impedance, gain, etc., as dictated by the needs of a wireless communication system (such as wireless communication system 100).

In the example illustrated in FIG. 1, the $Rx_1$ terminal of multi-throw switch 120 may be connected to an amplification path 140. In this example, amplification path 140 may connect (either directly or indirectly) the $Rx_1$ terminal of multi-throw switch 120 to a receiver 110. The term "receiver," as used herein, generally refers to any type or form of device or component (or group of devices or components) that, with the aid of an antenna, is capable of converting modulated signals (such as radio waves) into usable information.

As shown in FIG. 1, amplification path 140 may include at least one amplifier 144. The term "amplifier," as used herein, generally refers to any type or form of electronic device or component (or group of devices or components) capable of increasing the power of a signal. As such, amplifier 144 may, when the Ant terminal of multi-throw switch 120 is connected to the $Rx_1$ terminal of multi-throw switch 120, amplify signals received by antenna 130. As will be described in greater detail below, in one example amplifier 144 may represent a low-noise amplifier having either a fixed or a variable gain.

In the example illustrated in FIG. 1, the $Rx_2$ terminal of multi-throw switch 120 may be connected to a bypass path 150. In this example, bypass path 150 may connect (either directly or indirectly) the $Rx_2$ terminal of multi-throw switch 120 to receiver 110. In one embodiment, the overall gain of bypass path 150 may be less than the overall gain of amplification path 140. In some examples, bypass path 150 may have an overall negative gain (due to, e.g., the presence of attenuators, etc.), while amplification path 140 may have an overall positive gain (due to, e.g., the presence of amplifier 144). In other examples, the overall gain of bypass path 150 may be positive but less than the overall gain of amplification path 140. In either example, bypass path 150 may, when the Ant terminal of multi-throw switch 120 is connected to the $Rx_2$ terminal of multi-throw switch 120, provide a lower-gain path (when compared to the overall gain of amplification path 140) from antenna 130 to receiver 110.

In one embodiment, an external device or component (such as receiver 110) may control when multi-throw switch 120 switches between its $Rx_1$ and $Rx_2$ terminals (thereby connecting antenna 130 to amplification path 140 or bypass path 150, respectively). In another embodiment, multi-throw switch 120 may internally possess the active or passive circuitry required to switch between its $Rx_1$ and $Rx_2$ terminals.

In some examples, multi-throw switch 120 (or a device or component external to multi-throw switch 120, such as receiver 110) may be configured to direct signals received from antenna 130 between amplification path 140 and bypass path 150 based at least in part on at least one characteristic indicative of received signal strength at antenna 130. Examples of such characteristics include, without limitation, various signal-strength metrics (such as Watt- or Decibel-based metrics), received signal strength indicator (RSSI) values, received channel power indicator (RCPI) values, etc.

For example, receiver 110 may (via, e.g., control path 160) cause multi-throw switch 120 to connect antenna 130 to amplification path 140 (by, e.g., connecting the Ant terminal of multi-throw switch 120 to the $Rx_1$ terminal of multi-throw switch 120) when the strength of a signal received at antenna 130 fails to satisfy (e.g., falls below) a predetermined threshold. Conversely, receiver 110 may (via, e.g., control path 160) cause multi-throw switch 120 to connect antenna 130 to bypass path 150 (by, e.g., connecting the Ant terminal of multi-throw switch 120 to the $Rx_2$ terminal of multi-throw switch 120) when the strength of a signal received at antenna 130 satisfies (e.g., exceeds) a predetermined threshold. In either case, these predetermined thresholds may be set in accordance with a desired gain/ attenuation ratio, as reflected by the overall gains (positive or negative) of amplification path 140 and bypass path 150.

In some embodiments, wireless communication system 100 may include an additional multi-throw switch (Rx switch 170), positioned between amplification and bypass paths 140 and 150 and receiver 110, that directs signals from either amplification path 140 or bypass path 150 to receiver 110. As with multi-throw switch 120, Rx switch 170 generally represents any type or form of mechanical, electrical, or electronic device or component (or group of devices or components, active or passive) capable of diverting electric current from one electrical path to one or more alternative electrical paths.

In one example, Rx switch 170 may represent a multi-throw switch, such as a single pole, double throw (SP2T) switch. In this example, a common terminal (Com) of Rx switch 170 may be connected to a receive terminal (Rx) of receiver 110. In addition, a first receive terminal ($Rx_1$) of Rx switch 170 may be connected to amplification path 140, while a second receive terminal ($Rx_2$) of Rx switch 170 may be connected to bypass path 150.

In one embodiment, an external device or component (such as receiver 110, via control path 160) may control when Rx switch 170 switches between its $Rx_1$ and $Rx_2$ terminals (thereby connecting receiver 110 to amplification path 140 or bypass path 150, respectively). In another embodiment, Rx switch 170 may internally possess the active or passive circuitry required to switch between its $Rx_1$ and $Rx_2$ terminals. As with multi-throw switch 120, Rx switch 170 (or a device or component external to Rx switch 170, such as receiver 110) may control when receiver 110 connects to amplification path 140 or bypass path 150 based at least in part on at least one characteristic indicative of received signal strength at antenna 130.

For example, receiver 110 may (via, e.g., control path 160) cause Rx switch 170 to connect receiver 110 to amplification path 140 (by, e.g., connecting the Com terminal of Rx switch 170 to the $Rx_1$ terminal of Rx switch 170) when the strength of a signal received at antenna 130 fails to satisfy (e.g., falls below) a predetermined threshold. Conversely, receiver 110 may (via, e.g., control path 160) cause Rx switch 170 to connect receiver 110 to bypass path 150 (by, e.g., connecting the Com terminal of Rx switch 170 to the $Rx_2$ terminal of Rx switch 170) when the strength of a signal received at antenna 130 satisfies (e.g., exceeds) a predetermined threshold. In some examples, an external device or component (such as receiver 110) may simultaneously control the switching of both multi-throw switch 120 and Rx switch 170 via a single control path (e.g., control path 160).

Although Rx switch 170 may be positioned between receiver 110 and amplification and bypass paths 140 and 150, in at least one embodiment multi-throw switch 120 may represent the only switch (external or internal) positioned between antenna 130 and amplifier 144 of amplification path 140. As will be explained in greater detail below, by only placing a single switch between antenna 130 and amplifier 144, the systems described herein may optimize the overall noise figure of wireless communication system 100, potentially resulting in improved communication-link margins and quality.

In some examples, wireless communication system 100 may include a plurality of bypass paths. For example, instead of a single bypass path 150, wireless communication system 100 may include N+1 number of bypass paths, each of which may have a different overall gain. In this example, the differing gains of each of these bypass paths may enable wireless communication system 100 to granularly select appropriate gain/attenuation levels for received signals based on their signal strength, potentially resulting in improved communication-link margins and quality.

Figure 2:
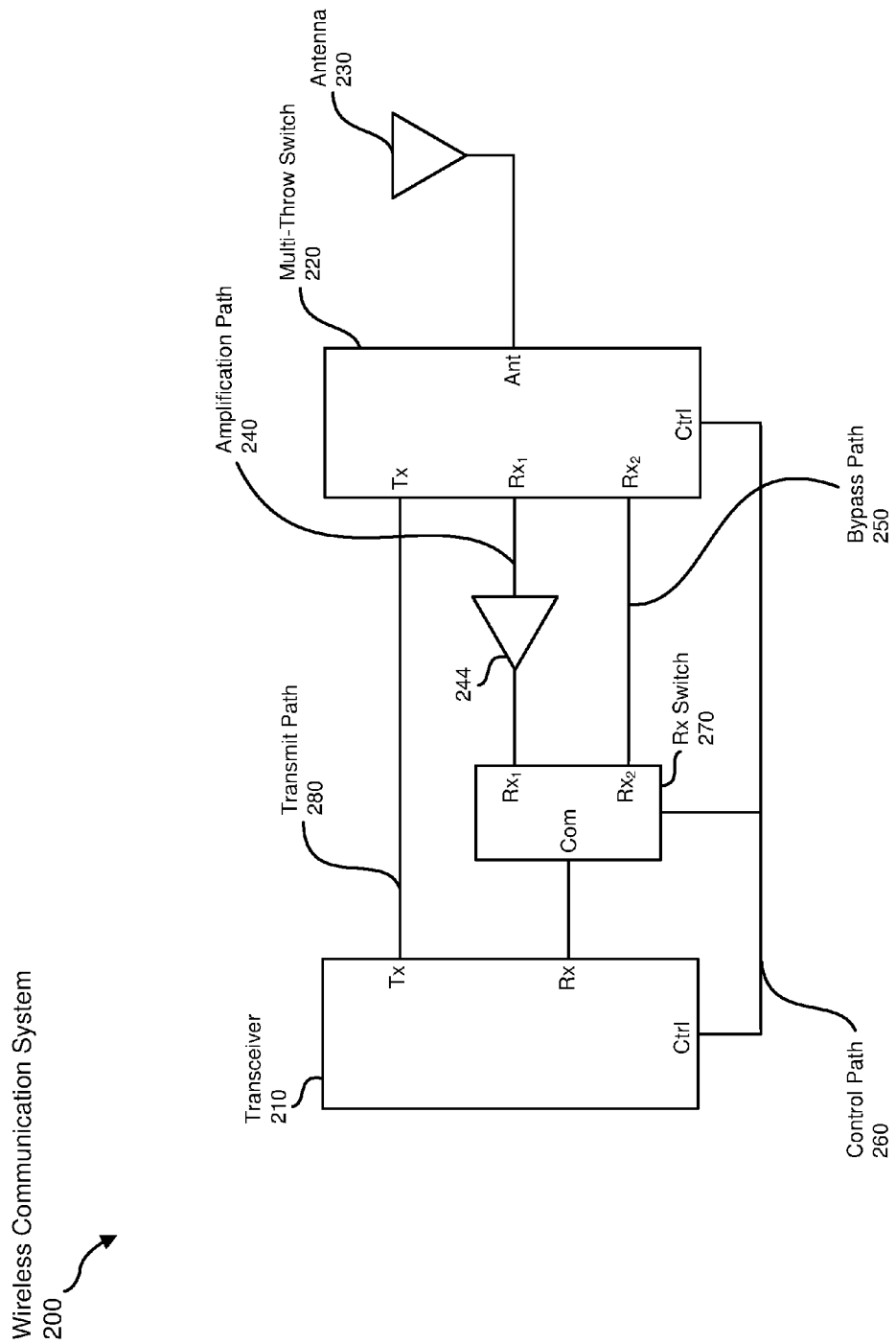
FIG. 2 is a block diagram of an additional exemplary wireless communication system capable of bypassing received-signal amplifiers.

In some embodiments, the systems described herein may be utilized in connection with a wireless communication system capable of both receiving and transmitting modulated signals. FIG. 2 is a block diagram of such an apparatus. As illustrated in this figure, wireless communication system 200 may include an antenna 230 connected to a transceiver 210 via a multi-throw switch 220. The term "transceiver," as used herein, generally refers to any type or form of device or component (or group of devices or components) having both a transmitter and a receiver. Similarly, the term "transmitter," as used herein, generally refers to any type or form of device or component (or group of devices or components) that, with the aid of an antenna, is capable of generating modulated signals, such as radio waves.

In the example illustrated in FIG. 2, multi-throw switch 220 may represent a single pole, triple throw (SP3T) switch capable of connecting a common terminal (Ant) to one of a transmit terminal (Tx) and a plurality of receive terminals ($Rx_1$ and $Rx_2$). As with multi-throw switch 120, the Ant terminal of multi-throw switch 220 may be connected (either directly or indirectly) to antenna 230. In addition, the Tx terminal of multi-throw switch 220 may be connected to a transmit path 280 that connects (either directly or indirectly) the Tx terminal of multi-throw switch 220 to a transmit terminal (Tx) of transceiver 210.

In this example, the $Rx_1$ terminal of multi-throw switch 220 may be connected to an amplification path 240 that connects (either directly or indirectly) the $Rx_1$ terminal of multi-throw switch 220 to a receive terminal (Rx) of transceiver 210. Similarly, the $Rx_2$ terminal of multi-throw switch 220 may be connected to a bypass path 250 that connects (either directly or indirectly) the $Rx_2$ terminal of multi-throw switch 220 to the Rx terminal of transceiver 210. As with wireless communication system 100 in FIG. 1, the overall gain of bypass path 250 in FIG. 2 may be less than the overall gain of amplification path 240.

In some examples, an external device or component (such as transceiver 210) may control when multi-throw switch 220 switches between its Tx, $Rx_1$, and $Rx_2$ terminals (thereby connecting antenna 230 to transmit path 280, amplification path 240, or bypass path 250, respectively). In another embodiment, multi-throw switch 220 may internally possess the active or passive circuitry required to switch between its Tx, Rx$_1$, and Rx$_2$ terminals.

For example, transceiver 210 may (via, e.g., control path 260) cause multi-throw switch 220 to connect antenna 230 to transmit path 280 (by, e.g., connecting the Ant terminal of multi-throw switch 220 to the Tx terminal of multi-throw switch 220) when transceiver 210 transmits signals via antenna 230. Alternatively, transceiver 210 may (via, e.g., control path 260) cause multi-throw switch 220 to connect antenna 230 to either amplification path 240 (by, e.g., connecting the Ant terminal of multi-throw switch 220 to the Rx$_1$ terminal of multi-throw switch 220) or bypass path 250 (by, e.g., connecting the Ant terminal of multi-throw switch 220 to the Rx$_2$ terminal of multi-throw switch 220) when transceiver 210 receives signals via antenna 230. As with wireless communication system 100 in FIG. 1, multi-throw switch 220 (or a device or component external to multi-throw switch 220, such as transceiver 210) may be configured to direct signals received from antenna 230 between amplification path 240 and bypass path 250 based at least in part on at least one characteristic indicative of received signal strength at antenna 230.

In some embodiments, wireless communication system 200 may include an additional multi-throw switch (Rx switch 270) positioned between the amplification and bypass paths 240 and 250 and the Rx terminal of transceiver 210. As with Rx switch 170, Rx switch 270 may represent an active or passive component or device (or group of components or devices) capable of directing signals from either amplification path 240 or bypass path 250 to the Rx terminal of transceiver 210. In some examples, Rx switch 270 (or a device or component external to Rx switch 270, such as transceiver 210) may control when the Rx terminal of transceiver 210 connects to amplification path 240 and bypass path 250.

As with multi-throw switch 120, in at least one embodiment multi-throw switch 220 may represent the only switch (external or internal) positioned between antenna 230 and amplifier 244 of amplification path 240. For example, multi-throw switch 220 may replace both (1) the single pole, dual throw (SP2T) transmit-receive switch that is traditionally connected to antenna 230 in an emulated full-duplex system (such as a TDD system) and (2) the external or internal bypass switch that is traditionally used to bypass amplifier 244. By only placing a single switch between antenna 230 and amplifier 244, the systems described herein may optimize the overall noise figure of wireless communication system 200, potentially resulting in improved communication-link margins and quality.

Figure 3:
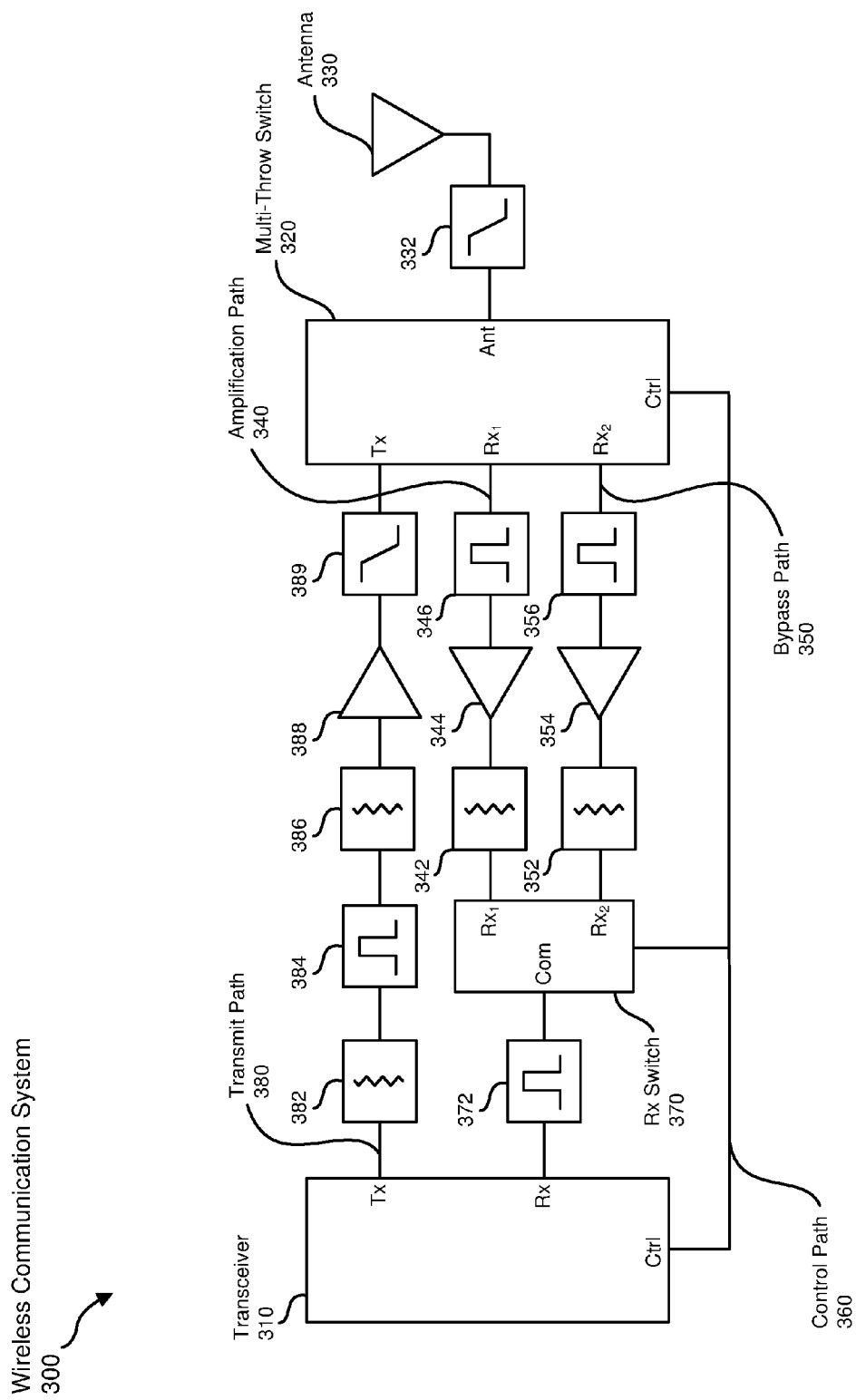
FIG. 3 is a block diagram of an additional exemplary wireless communication system capable of bypassing received-signal amplifiers.
Figure 4:
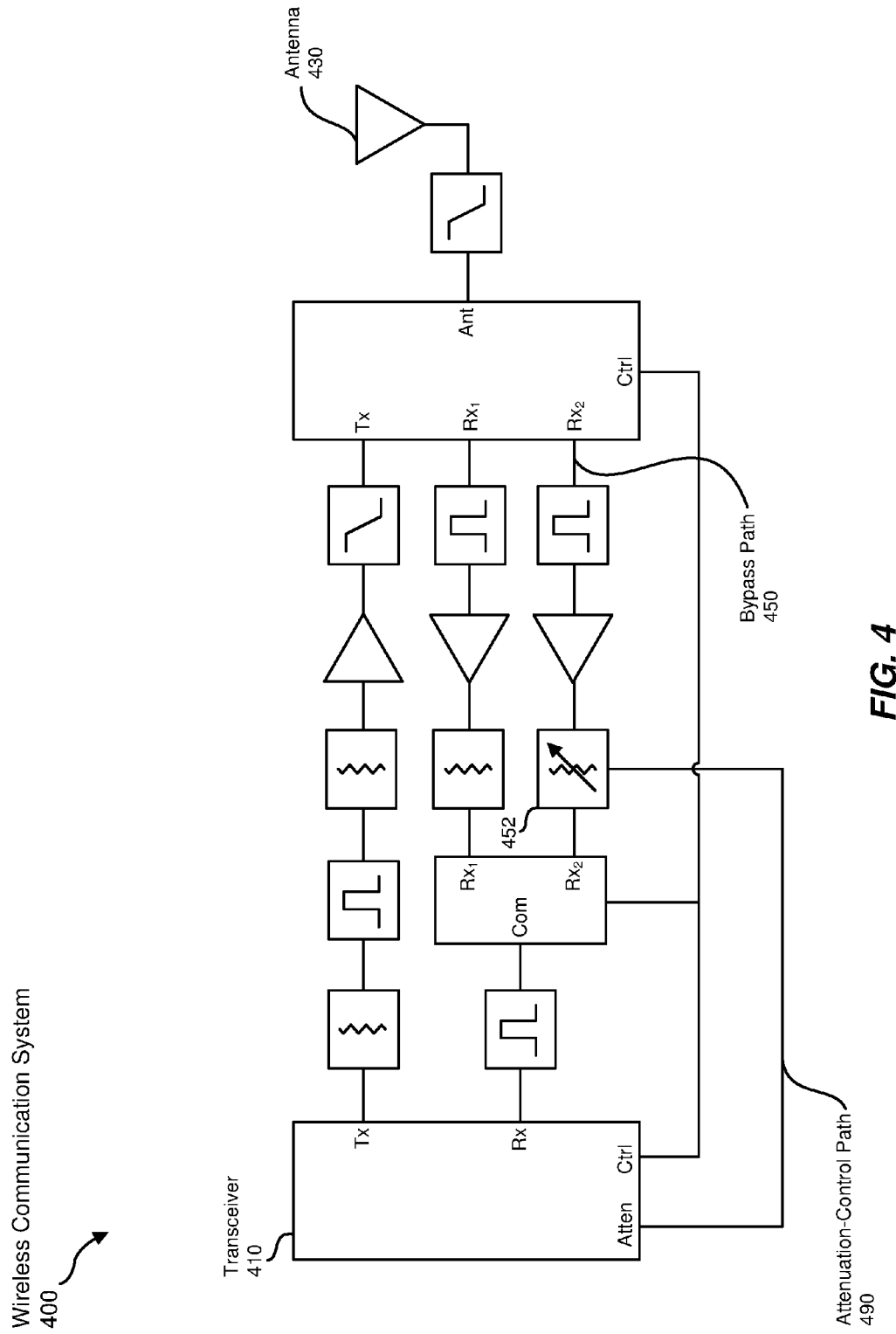
FIG. 4 is a block diagram of an additional exemplary wireless communication system capable of bypassing received-signal amplifiers.
Figure 5:
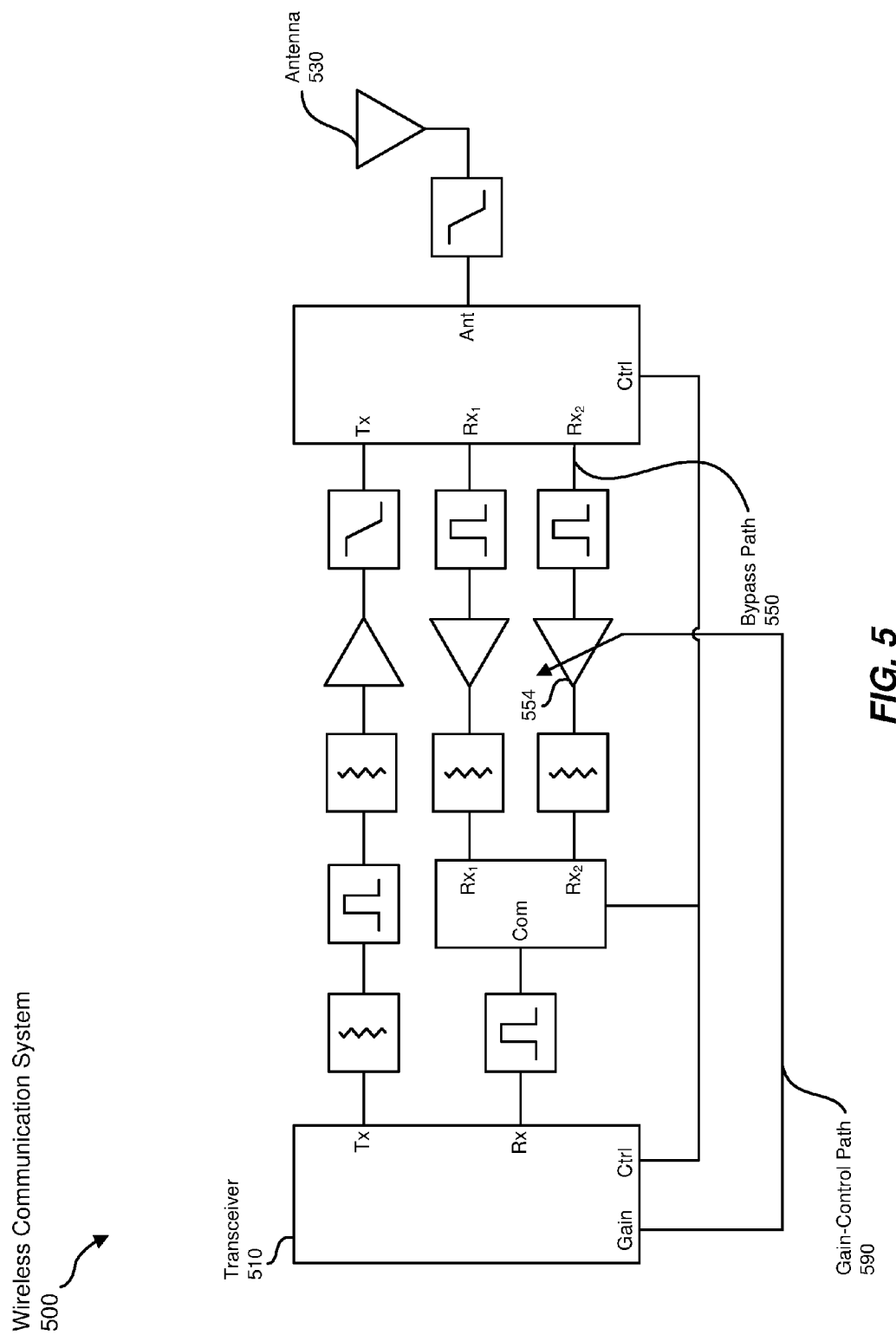
FIG. 5 is a block diagram of an additional exemplary wireless communication system capable of bypassing received-signal amplifiers.

In some examples, the wireless communication systems described in connection with FIGS. 1 and 2 may be modified and/or tailored to achieve a variety of additional goals and/or realize additional desired functionality. FIGS. 3-5 provide illustrations of an exemplary set of such modifications.

As shown in FIG. 3, wireless communication system 300 may include an antenna 330 connected to a transceiver 310 via a multi-throw switch 320. In this example, the common terminal (Ant) of multi-throw switch 320 may be indirectly connected to antenna 330 via a low-pass filter 332. The term "filter," as used herein, generally refers to any type or form of device capable of removing unwanted components or features from a signal. In one example, low-pass filter 332 may (1) pass signals that have frequencies that fall below a predetermined cutoff frequency and (2) attenuate any signals that have frequencies that exceed the predetermined cutoff frequency. In this example, low-pass filter 332 may be used to filter harmonics generated by an amplifier (e.g., amplifier 388) in transmit path 380.

In the example illustrated in FIG. 3, a transmit terminal (Tx) of multi-throw switch 320 may be connected to a transmit path 380 that connects the Tx terminal of multi-throw switch 320 to a transmit terminal (Tx) of transceiver 310. Transmit path 380 may be configured in a variety of ways and include any of a variety of different components, such as one or more attenuators, filters, and/or amplifiers. The term "attenuator," as used herein, generally refers to any type or form of device or component (or group of devices or components) capable of reducing the power of a signal.

In the example illustrated in FIG. 3, transmit path 380 may include a first-stage attenuator 382 (designed to produce a first stage of desired attenuation), a band-pass filter 384 (designed to attenuate spurious signals), a second-stage attenuator 386 (designed to produce a second stage of desired attenuation), an amplifier 388 (designed to amplify signals generated by transceiver 310 to a desirable level for transmission by antenna 330), and a low-pass filter 389 (designed to filter harmonics generated by amplifier 388), each of which may be sequentially connected in series between the Tx terminal of transceiver 310 and the Tx terminal of multi-throw switch 320.

In addition, a first receive terminal (Rx$_1$) of multi-throw switch 320 may be connected to an amplification path 340 that connects the Rx$_1$ terminal of multi-throw switch 320 to a receive terminal (Rx) of transceiver 310. Similarly, a second receive terminal (Rx$_2$) of multi-throw switch 320 may be connected to a bypass path 350 that connects the Rx$_2$ terminal of multi-throw switch 320 to the Rx terminal of transceiver 310. As with transmit path 380, amplification path 340 and bypass path 350 may be configured in a variety of ways and include any of a variety of different components, such as one or more attenuators, filters, and/or amplifiers.

In the example illustrated in FIG. 3, amplification path 340 may include a band-pass filter 346 (designed to attenuate unwanted signals received by antenna 330), an amplifier 344 (designed to amplify the signals received by antenna 330 to a desirable level for processing by transceiver 310), and an attenuator 342 (designed to produce a desired attenuation), each of which may be sequentially connected in series between the Rx$_1$ terminal of multi-throw switch 320 and a first receive terminal (Rx$_1$) of Rx switch 370. Similarly, bypass path 350 may include a band-pass filter 356 (designed to attenuate unwanted signals received by antenna 330), an amplifier 354 (designed to amplify the signals received by antenna 330 to a desirable level for processing by transceiver 310), and an attenuator 352 (designed to produce a desired attenuation), each of which may be sequentially connected in series between a second receive terminal (Rx$_2$) terminal of multi-throw switch 320 and the Rx$_2$ terminal of Rx switch 370. In some embodiments, a common terminal (Com) of Rx switch 370 may be indirectly connected to the Rx terminal of transceiver 310 via a band-pass filter 372 designed to attenuate spurious signals.

As with wireless communication systems 100 and 200 in FIGS. 1 and 2, the overall gain of bypass path 350 may be less than the overall gain of amplification path 340. In some examples, bypass path 350 may have an overall negative gain (due to, e.g., the values of attenuator 352 and/or amplifier 354), while amplification path 340 may have an overall positive gain (due to, e.g., the values of attenuator 342 and/or amplifier 344). In other examples, the overall gain of bypass path 350 may be positive but less than the overall gain of amplification path 340. In either example, the differing gains of these paths may enable wireless communication system 300 to granularly select appropriate gain/attenuation levels for received signals based on their signal strength, potentially resulting in improved communication-link margins and quality.

As with multi-throw switch 220, multi-throw switch 320 (or a device or component external to multi-throw switch 320, such as transceiver 310 via control path 360) may control when multi-throw switch 320 switches between the Tx, $Rx_1$, and $Rx_2$ terminals of multi-throw switch 320 (thereby connecting antenna 330 to transmit path 380, amplification path 340, or bypass path 350, respectively). Similarly, Rx switch 370 (or a device or component external to Rx switch 370, such as transceiver 310 via control path 360) may control when the Rx terminal of transceiver 310 connects to amplification path 340 and bypass path 350.

In some examples, the values of the various components described in connection with FIGS. 1-3 may be dynamically variable, as opposed to fixed. Specifically, one or more of the attenuators, filters, and/or amplifiers contained within the wireless communication systems described and/or illustrated herein may represent variable attenuators, variable filters, and/or variable-gain amplifiers, as illustrated in FIGS. 4 and 5.

For example, and as shown in FIG. 4, bypass path 450 of wireless communication system 400 may include a variable attenuator 452. In this example, the attenuation value of variable attenuator 452 may be dynamically controlled by an external component or device, such as transceiver 410 (via, e.g., attenuation-control path 490).

In some examples, transceiver 410 may control the attenuation value of variable attenuator 452 based at least in part on at least one characteristic indicative of received signal strength at antenna 430. For example, transceiver 410 may (via, e.g., attenuation-control path 490) lower the attenuation value of variable attenuator 452 when the strength of a signal received at antenna 430 fails to satisfy (e.g., falls below) a predetermined threshold. Conversely, transceiver 410 may (via, e.g., attenuation-control path 490) raise the attenuation value of variable attenuator 452 when the strength of a signal received at antenna 430 satisfies (e.g., exceeds) a predetermined threshold. In either example, the variable attenuation value of variable attenuator 452 may enable wireless communication system 400 to granularly select appropriate attenuation levels for received signals based on their signal strength, potentially resulting in improved communication-link margins and quality.

Similarly, as shown in FIG. 5, bypass path 550 of wireless communication system 500 may include a variable-gain amplifier 554. In this example, the gain of variable-gain amplifier 554 may be dynamically controlled by an external component or device, such as transceiver 510 (via, e.g., gain-control path 590).

In some examples, transceiver 510 may control the gain of variable-gain amplifier 554 based at least in part on at least one characteristic indicative of received signal strength at antenna 530. For example, transceiver 510 may (via, e.g., gain-control path 590) raise the gain of variable-gain amplifier 554 when the strength of a signal received at antenna 530 fails to satisfy (e.g., falls below) a predetermined threshold. Conversely, transceiver 510 may (via, e.g., gain-control path 590) lower the gain of variable-gain amplifier 554 when the strength of a signal received at antenna 530 satisfies (e.g., exceeds) a predetermined threshold. In either example, variable-gain amplifier 554 may enable wireless communication system 500 to granularly select appropriate gain levels for received signals based on their signal strength, potentially resulting in improved communication-link margins and quality.

Figure 6:
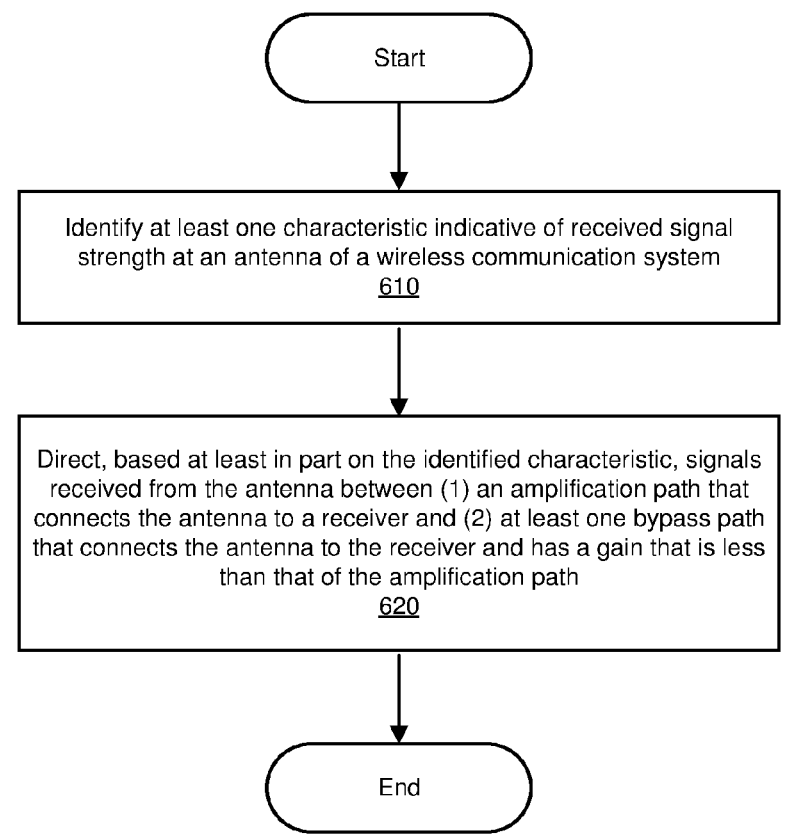
FIG. 6 is a flow diagram of an exemplary method for bypassing received-signal amplifiers.

FIG. 6 is a flow diagram of an exemplary method 600 for bypassing amplifiers used to amplify signals received by wireless communication systems. As shown in this figure, at step 610 the systems described herein may identify at least one characteristic indicative of received signal strength at an antenna of a wireless communication system. For example, multi-throw switch 320 in FIG. 3 (or a device or component external to multi-throw switch 320, such as transceiver 310) may identify the strength of a signal received at antenna 330.

At step 620, the systems described herein may direct, based at least in part on the characteristic identified in step 610, signals received from the antenna between (1) an amplification path that connects the antenna to a receiver of the wireless communication system and (2) at least one bypass path that connects the antenna to the receiver and has a gain that is less than a gain of the amplification path. For example, multi-throw switch 320 in FIG. 3 (or a device or component external to multi-throw switch 320, such as transceiver 310) may direct signals received from antenna 330 between amplification path 340 and bypass path 350 based at least in part on at least one characteristic indicative of received signal strength at antenna 330. Upon completion of step 620, exemplary method 600 may terminate.

As detailed above, by replacing the traditional cascade of transmit/receive and bypass switches positioned between an antenna and an amplifier used to amplify signals received from the antenna with a single multi-throw switch, the embodiments described herein may optimize the overall noise figure of a wireless communication system. In addition, by providing at least one amplifier bypass path from this multi-throw switch, the embodiments disclosed herein may allow for the gain/attenuation of this bypass path to be customized without having to modify the amplifier itself. Moreover, by using a variable-gain amplifier and/or variable attenuator in this bypass path and/or by providing a plurality of bypass paths having differing gains, the embodiments disclosed herein may enable the wireless communication system to granularly select appropriate gain/attenuation levels for received signals based on their signal strength, potentially resulting in improved communication-link margins and quality.

Figure 7:
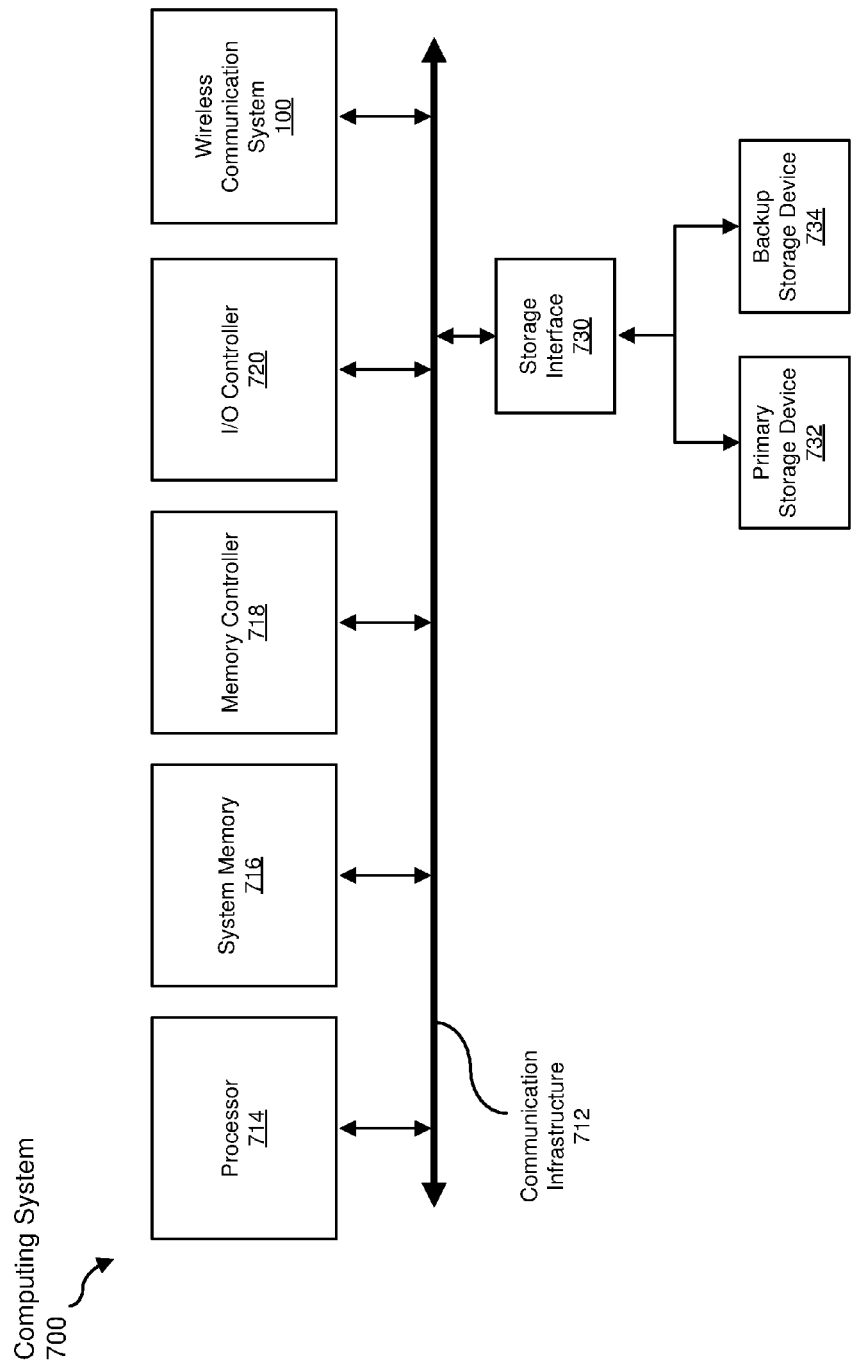
FIG. 7 is a block diagram of an exemplary computing system capable of implementing and/or being used in connection with one or more of the embodiments described and/or illustrated herein.

FIG. 7 is a block diagram of an exemplary computing system 700 incorporating and/or capable of being used in connection with one or more of the embodiments described and/or illustrated herein. In one example, computing system 700 may include wireless communication system 100 from FIG. 1. Wireless communication system 100 may be included in computing system 700 as an integrated component, as a removable card, as part of one or more of the components shown in computing system 700, and/or in any other suitable manner. Computing system 700 may also include one or more of the other components presented in connection with the other wireless communication systems described and/or illustrated herein.

As detailed above, wireless communication system 100 broadly represents any type or form of communication device or adapter capable of facilitating communication between a computing system (such as exemplary computing system 700) and one or more additional devices. For example, in certain embodiments wireless communication system 100 may facilitate communication between computing system 700 and a private or public network including additional computing systems. Examples of wireless communication system 100 include, without limitation, a wireless network interface (such as a wireless network interface card or wireless access point) and any other suitable interface. In at least one embodiment, wireless communication system 100 may provide a direct connection to a remote server via a direct link to a network, such as the Internet. Wireless communication system 100 may also indirectly provide such a connection through, for example, a local area network (such as an Ethernet network), a personal area network, a wide area network, a private network (e.g., a virtual private network), a telephone or cable network, a cellular telephone connection, a satellite data connection, or any other suitable connection.

In certain embodiments, wireless communication system 100 may also represent a host adapter configured to facilitate communication between computing system 700 and one or more additional network or storage devices via an external bus or communications channel. Wireless communication system 100 may also enable computing system 700 to engage in distributed or remote computing. For example, wireless communication system 100 may receive instructions from a remote device or send instructions to a remote device for execution.

In some embodiments, all or a portion of computing system 700 may perform and/or be a means for performing, either alone or in combination with other elements, one or more of the steps described in connection with FIG. 6. All or a portion of computing system 700 may also perform and/or be a means for performing and/or implementing any other steps, methods, or processes described and/or illustrated herein.

Computing system 700 broadly represents any single or multi-processor computing device or system capable of executing computer-readable instructions. Examples of computing system 700 include, without limitation, workstations, laptops, client-side terminals, servers, distributed computing systems, mobile devices, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), and/or any other type or form of computing system or device.

Computing system 700 may be programmed, configured, and/or otherwise designed to comply with one or more networking protocols. According to certain embodiments, computing system 700 may be designed to work with protocols of one or more layers of the Open Systems Interconnection (OSI) reference model, such as a physical layer protocol, a link layer protocol, a network layer protocol, a transport layer protocol, a session layer protocol, a presentation layer protocol, and/or an application layer protocol. For example, computing system 700 may include a network device configured according to a Universal Serial Bus (USB) protocol, an Institute of Electrical and Electronics Engineers (IEEE) 1394 protocol, an Ethernet protocol, a T1 protocol, a Synchronous Optical Networking (SONET) protocol, a Synchronous Digital Hierarchy (SDH) protocol, an Integrated Services Digital Network (ISDN) protocol, an Asynchronous Transfer Mode (ATM) protocol, a Point-to-Point Protocol (PPP), a Point-to-Point Protocol over Ethernet (PPPoE), a Point-to-Point Protocol over ATM (PPPoA), a Bluetooth protocol, an IEEE 802.XX protocol, a frame relay protocol, a token ring protocol, a spanning tree protocol, and/or any other suitable protocol.

Computing system 700 may include various network and/or computing components. For example, computing system 700 may include at least one processor 714 and a system memory 716. Processor 714 generally represents any type or form of processing unit capable of processing data or interpreting and executing instructions. Processor 714 may include an ASIC, a system on a chip (e.g., a network processor), a hardware accelerator, a general purpose processor, and/or any other suitable processing element.

Processor 714 may process data according to one or more of the networking protocols discussed above. For example, processor 714 may execute or implement a portion of a protocol stack, may process packets, may perform memory operations (e.g., queuing packets for later processing), may execute end-user applications, and/or may perform any other processing tasks.

System memory 716 generally represents any type or form of volatile or non-volatile storage device or medium capable of storing data and/or other computer-readable instructions. Examples of system memory 716 include, without limitation, Random Access Memory (RAM), Read Only Memory (ROM), flash memory, or any other suitable memory device. Although not required, in certain embodiments computing system 700 may include both a volatile memory unit (such as, for example, system memory 716) and a non-volatile storage device (such as, for example, primary storage device 732, as described in detail below). System memory 716 may be implemented as shared memory and/or distributed memory in a network device. Furthermore, system memory 716 may store packets and/or other information used in networking operations.

In certain embodiments, exemplary computing system 700 may also include one or more components or elements in addition to processor 714 and system memory 716. For example, as illustrated in FIG. 7, computing system 700 may include a memory controller 718, an Input/Output (I/O) controller 720, and wireless communication system 100, each of which may be interconnected via a communication infrastructure 712. Communication infrastructure 712 generally represents any type or form of infrastructure capable of facilitating communication between one or more components of a computing device. Examples of communication infrastructure 712 include, without limitation, a communication bus (such as a Serial ATA (SATA), an Industry Standard Architecture (ISA), Peripheral Component Interconnect (PCI), PCI Express (PCIe), and/or any other suitable bus), and a network.

Memory controller 718 generally represents any type or form of device capable of handling memory or data or controlling communication between one or more components of computing system 700. For example, in certain embodiments memory controller 718 may control communication between processor 714, system memory 716, and I/O controller 720 via communication infrastructure 712. In some embodiments, memory controller 718 may include a Direct Memory Access (DMA) unit that may transfer data (e.g., packets) to or from a link adapter.

I/O controller 720 generally represents any type or form of module capable of coordinating and/or controlling the input and output functions of a computing device. For example, in certain embodiments I/O controller 720 may control or facilitate transfer of data between one or more elements of computing system 700, such as processor 714, system memory 716, wireless communication system 100, and storage interface 730.

As illustrated in FIG. 7, exemplary computing system 700 may also include a primary storage device 732 and/or a backup storage device 734 coupled to communication infrastructure 712 via a storage interface 730. Storage devices 732 and 734 generally represent any type or form of storage device or medium capable of storing data and/or other computer-readable instructions. For example, storage devices 732 and 734 may be a magnetic disk drive (e.g., a so-called hard drive), a solid state drive, a floppy disk drive, a magnetic tape drive, an optical disk drive, a flash drive, or the like. Storage interface 730 generally represents any type or form of interface or device for transferring data between storage devices 732 and 734 and other components of computing system 700.

In certain embodiments, storage devices 732 and 734 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 732 and 734 may also include other similar structures or devices for allowing computer software, data, or other computer-readable instructions to be loaded into computing system 700. For example, storage devices 732 and 734 may be configured to read and write software, data, or other computer-readable information. Storage devices 732 and 734 may be a part of computing system 700 or may be separate devices accessed through other interface systems.

Many other devices or subsystems may be connected to computing system 700. Conversely, all of the components and devices illustrated in FIG. 7 need not be present to practice the embodiments described and/or illustrated herein. The devices and subsystems referenced above may also be interconnected in different ways from those shown in FIG. 7. Computing system 700 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable-storage medium. The phrase "computer-readable-storage medium" generally refers to any form of device, carrier, or medium capable of storing or carrying computer-readable instructions. Examples of computer-readable-storage media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of wireless communication system 100 in FIG. 1 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. An apparatus comprising:
a multi-throw switch having a common terminal connected to an antenna of a wireless communication system, the multi-throw switch configured to direct signals received from the antenna between:
an amplification path that connects a receive terminal of the multi-throw switch to a receiver of the wireless communication system, the amplification path comprising at least one amplifier that amplifies signals received from the antenna; and
at least one bypass path that connects an additional receive terminal of the multi-throw switch to the receiver, the bypass path comprising at least:
a filter that attenuates unwanted signals received from the antenna;
an attenuator that optionally produces a desired attenuation of signals received from the antenna; and
a bypass amplifier that optionally produces a desired amplification of signals received from the antenna and that has a gain that is less than a gain of the amplification path;
wherein the filter in the bypass path comprises a bandpass filter that removes signals outside of a certain frequency range received from the antenna.

2. The apparatus of claim 1, further comprising at least one transmit path that connects a transmit terminal of the multi-throw switch to a transmitter of the wireless communication system.

3. The apparatus of claim 2, wherein the transmitter and the receiver collectively comprise a transceiver that is configured to control when the multi-throw switch connects the antenna to the amplification path, the bypass path, and the transmit path.

4. The apparatus of claim 3, wherein the transceiver is configured to cause the multi-throw switch to connect the antenna to the amplification path when at least one characteristic indicative of received signal strength at the antenna fails to satisfy a predetermined threshold.

5. The apparatus of claim 3, wherein the transceiver is configured to cause the multi-throw switch to connect the antenna to the bypass path when at least one characteristic indicative of received signal strength at the antenna satisfies a predetermined threshold.

6. The apparatus of claim 1, wherein the multi-throw switch is the only switch positioned between the antenna and the amplifier of the amplification path.

7. The apparatus of claim 1, wherein the amplification path further comprises at least one of:
an amplification filter; and
an amplification attenuator.

8. The apparatus of claim 1, wherein the amplifier in the amplification path comprises a low-noise amplifier.

9. The apparatus of claim 1, wherein the bypass path further comprises a low-pass filter that removes harmonics generated by the bypass amplifier.

10. The apparatus of claim 1, wherein the attenuator in the bypass path comprises at least one of:
a fixed attenuator; and
a variable attenuator.

11. The apparatus of claim 10, wherein the receiver is configured to vary the variable attenuator's attenuation value based at least in part on at least one characteristic indicative of received signal strength at the antenna.

12. The apparatus of claim 1, wherein the bypass amplifier comprises at least one of:
a fixed-gain amplifier; and
a variable-gain amplifier.

13. The apparatus of claim 12, wherein the receiver is configured to vary a gain of the variable-gain amplifier based at least in part on at least one characteristic indicative of received signal strength at the antenna.

14. The apparatus of claim 1, further comprising an additional multi-throw switch that is connected to a receive terminal of the receiver and that is configured to control when the receiver connects to the amplification path and the bypass path.

15. The apparatus of claim 14, wherein the receiver is configured to control when the additional multi-throw switch connects the receiver to the amplification path and the bypass path.

16. The apparatus of claim 1, wherein the bypass path comprises a plurality of bypass paths that each have differing gains.

17. A wireless communication system comprising:
an antenna;
a receiver; and
a multi-throw switch having a common terminal connected to the antenna, the multi-throw switch configured to direct signals received from the antenna between:
an amplification path that connects a receive terminal of the multi-throw switch to the receiver, the amplification path comprising at least one amplifier that amplifies signals received from the antenna; and
at least one bypass path that connects an additional receive terminal of the multi-throw switch to the receiver, the bypass path comprising at least:
a filter that attenuates unwanted signals received from the antenna;
an attenuator that optionally produces a desired attenuation of signals received from the antenna; and
a bypass amplifier that optionally produces a desired amplification of signals received from the antenna and that has a gain that is less than a gain of the amplification path;
wherein the filter in the bypass path comprises a bandpass filter that removes signals outside of a certain frequency range received from the antenna.

18. The wireless communication system of claim 17, further comprising:
a transmitter; and
at least one transmit path that connects a transmit terminal of the multi-throw switch to the transmitter.

19. The wireless communication system of claim 18, wherein the transmitter and the receiver collectively comprise a transceiver that is configured to control when the multi-throw switch connects the antenna to the amplification path, the bypass path, and the transmit path.

20. A method comprising:
identifying at least one characteristic indicative of received signal strength at an antenna of a wireless communication system; and
directing, based at least in part on the identified characteristic, signals received from the antenna between:
an amplification path that connects the antenna to a receiver of the wireless communication system, the amplification path comprising at least one amplifier that amplifies signals received from the antenna; and
at least one bypass path that connects the antenna to the receiver, the bypass path comprising at least:
a filter that attenuates unwanted signals received from the antenna;
an attenuator that optionally produces a desired attenuation of signals received from the antenna; and
a bypass amplifier that optionally produces a desired amplification of signals received from the antenna and that has a gain that is less than a gain of the amplification path;
wherein the filter in the bypass path comprises a bandpass filter that removes signals outside of a certain frequency range received from the antenna.

* * * * *